United States Patent
Liu et al.

(10) Patent No.: US 7,091,077 B1
(45) Date of Patent: Aug. 15, 2006

(54) METHOD OF DIRECTIONALLY TRIMMING POLYSILICON WIDTH

(75) Inventors: David Kuan-Yu Liu, Fremont, CA (US); Jonathan Cheang-Whang Chang, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/146,514

(22) Filed: Jun. 7, 2005

(51) Int. Cl.
*H01L 21/336* (2006.01)

(52) U.S. Cl. .............................. 438/197; 257/E21.327; 257/E21.623

(58) Field of Classification Search ................ 438/671; 257/47, 124, 151, 162, 249, 343, 351
See application file for complete search history.

(56) References Cited

U.S. PATENT DOCUMENTS 5,922,516 A * 7/1999 Yu et al. .................... 430/314
6,287,904 B1 * 9/2001 Lee et al. ................... 438/197
6,787,854 B1 * 9/2004 Yang et al. ................. 257/348
2003/0049876 A1 * 3/2003 Mori et al. ................... 438/23

* cited by examiner

*Primary Examiner*—W. David Coleman
*Assistant Examiner*—Jarrett J. Stark
(74) *Attorney, Agent, or Firm*—Scott Hewett

(57) ABSTRACT

Polysilicon or other material is directionally trimmed using two layers of photoresist and a photoresist etching process, such as ashing. A first layer of photoresist is patterned on a wafer. Portions of the first patterned photoresist are covered with a second layer of photoresist. The photoresist is trimmed to reduce the size of the exposed portions of the first patterned photoresist without reducing the size of the covered portions of the first patterned photoresist. The second layer of photoresist is removed. The selectively etched patterned first layer of photoresist is used as a process mask to define a structure in the underlying material. In a particular embodiment, the second photoresist covers end-cap portions of gate photoresist. Directional trimming reduces the width of a polysilicon gate structure (i.e. gate length) over an active area of an FET, without reducing the length of original first patterned photoresist.

16 Claims, 4 Drawing Sheets

METHOD OF DIRECTIONALLY TRIMMING POLYSILICON WIDTH

FIELD OF THE INVENTION

This invention relates generally to techniques for fabricating integrated circuits, and more particularly to trimming photoresist patterns on an integrated circuit.

BACKGROUND OF THE INVENTION

Polysilicon is a material commonly used as a conductor in the fabrication of integrated circuits ("I.C.s"). Polysilicon is particularly desirable for forming gates of metal-oxide-semiconductor ("MOS")-type field-effect transistors ("FETs"). Polysilicon gates for sub-micron FETs are often defined from a layer of polysilicon in a two-step process because of physical limitations of photomask techniques.

First, a layer of photoresist is formed over the polysilicon layer, exposed to light through a photomask, and developed to remove the undesired areas of photoresist. The minimum dimension that can be patterned in the photoresist depends on the wavelength of the light used to expose the photoresist, among other factors. The developed photoresist over the polysilicon gate areas is baked and then anisotropically etched. This etching reduces the size of the photoresist, resulting in a finer linewidth than the pre-etched photoresist. Thus, a linewidth that is narrower than what could be produced by photolithography alone is transferred to the photoresist pattern.

Etching reduces both the length and the width of the gate photoresist. A narrow width is desirable to provide a short channel length to the eventual FET; however, for proper FET operation, the gate extends beyond the active region of the FET to form what is commonly known as a "poly endcap." Providing a poly endcap avoids shorting of the FET terminals. The gate photoresist pattern is then made longer in the direction it extends beyond the active region to compensate for the length that will be lost during the etching process in order to maintain the desired overlap, which is the amount the gate extends beyond the active area to overlap the substrate. This undesirably increases the distance between FETs on a wafer, reducing the packing density.

Thus, it is desirable to selectively trim the linewidth of a photoresist pattern and improve packing density.

SUMMARY OF THE INVENTION

Polysilicon or other material is directionally trimmed using two layers of photoresist and a photoresist etching process, such as ashing. A first layer of photoresist is patterned on a wafer. Portions of the first patterned photoresist are covered with a second layer of photoresist. The photoresist is trimmed to reduce the size of the exposed portions of the first patterned photoresist without reducing the size of the covered portions of the first patterned photoresist. The second layer of photoresist is removed. The selectively etched patterned first layer of photoresist is used as a process mask to define a structure in the underlying material. In a particular embodiment, the second photoresist covers endcap portions of gate photoresist. Directional trimming reduces the width of a polysilicon gate structure (i.e. gate length) over an active area of an FET, without reducing the length of original first patterned photoresist.

DETAILED DESCRIPTION OF THE DRAWINGS

Figure 1A:
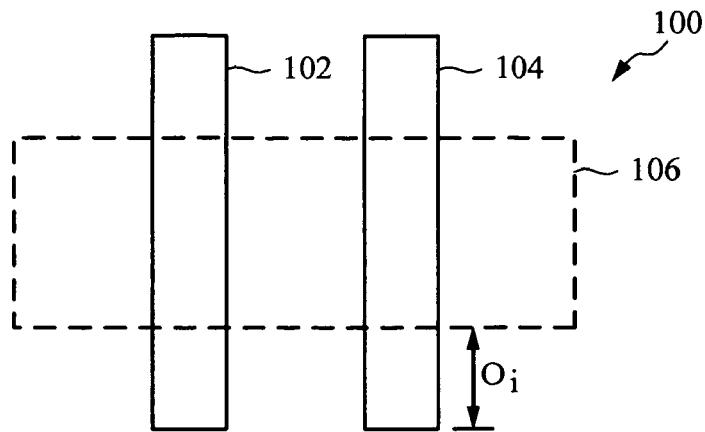
FIG. 1A is a plan view representing an as-drawn gate photoresist pattern for a CMOS cell.

FIG. 1A is a plan view representing an as-drawn gate photoresist pattern for a CMOS cell 100. As-drawn gate patterns 102, 104, such as the idealized gate pattern on a photomask, are shown superimposed on an active area 106 of a CMOS cell formed in a semiconductor substrate, such as a silicon wafer. The as-drawn gate patterns 102, 104 are relatively high-aspect rectangles defined on either a positive or negative photomask.

In a positive photomask, the gate patterns are opaque and the field of the mask is clear. The resulting photoresist pattern on the surface of a processing wafer follows the opaque pattern on the photomask. In a negative photomask, the gate patterns are clear and the field of the mask is opaque. The resulting photoresist pattern is the negative of the photomask. That is, after developing, the photoresist remains on the wafer where the clear portions of the negative photomask occur. The as-drawn gate patterns 102, 104 are shown as positive (i.e. opaque) mask elements, but alternatively are negative (i.e. clear) mask elements.

The as-drawn gate patterns 102, 104 extend beyond both sides of the active area 106 to provide poly endcaps in the finished device. The as-drawn gate patterns 102, 104 are longer than the eventual polysilicon gate structures will be. The longer as-drawn gate pattern accounts for shortening of the gate photoresist that occurs from exposure and development and from photoresist trimming. An example of a suitable photoresist trimming process commonly known in the art is an ashing process. The initial overlap, $O_i$, extends from the edge of the active area 106 to the end of the as-drawn gate pattern 104.

Figure 1B:
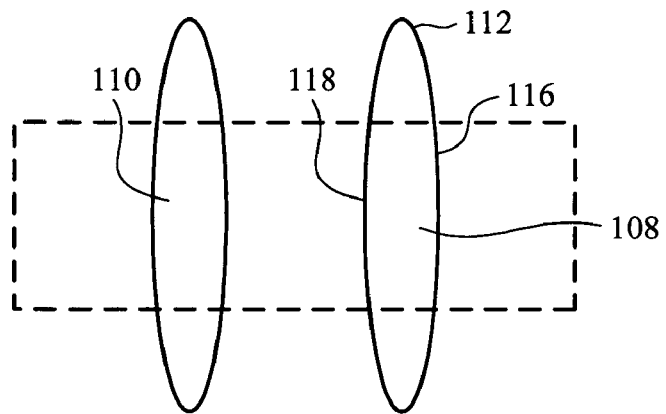
FIG. 1B is a plan view representing the CMOS cell of FIG. 1A after developing the photoresist.

FIG. 1B is a plan view representing the CMOS cell of FIG. 1A after developing the photoresist. Using conventional techniques well-known to those of skill in the art, a layer of photoresist is formed on a wafer, exposed, and developed, producing gate photoresist patterns 108, 110. Rounding occurs at endcap portions 112, 114 and along center photoresist portions 116, 118 as a result of the exposure and development process. It is also common for the length of the gate photoresist pattern to be less than the as-drawn length of the gate pattern (compare ref. num. 108 with FIG. 1A, ref. num. 104).

Figure 1C:
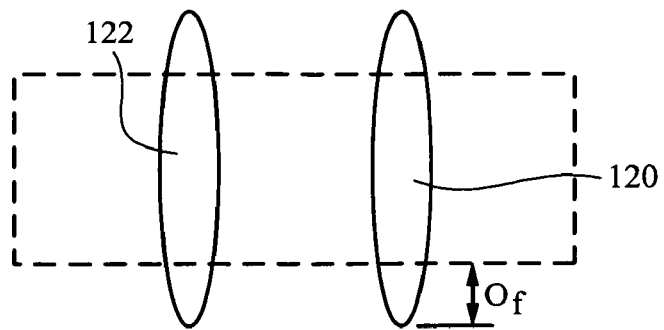
FIG. 1C is a plan view of the CMOS cell of FIG. 1B after anisotropic etch.

FIG. 1C is a plan view of the CMOS cell of FIG. 1B after photoresist trimming, which in a particular embodiment is an anisotropic etch. The anisotropic etch has removed photoresist material from the gate photoresist patterns 108, 110 shown in FIG. 1B to produce trimmed gate photoresist patterns 120, 122. Etching has reduced the width (i.e. channel length) of the photoresist patterns to less than that achieved with the photolithographic technique. However, the length of the trimmed gate photoresist patterns 120, 122 has also been shortened from the length of the as-drawn photoresist patterns 108, 110 of FIG. 1B. This shortening reduces the endcap overlap to a final endcap overlap, $O_f$. In order to account for this shortening, a suitably large initial overlap is provided, which undesirably reduces packing density of FETs on the wafer.

Figure 2A:
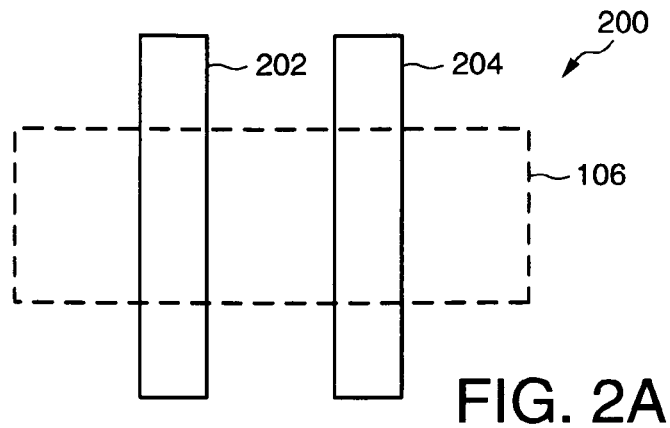
FIGS. 2A–2H illustrate a processing sequence according to an embodiment of the invention.

FIGS. 2A–2H illustrate a processing sequence according to an embodiment of the invention. FIG. 2A is a plan view representing an as-drawn gate photoresist pattern for a CMOS cell 200. As-drawn gate patterns 202, 204, such as the idealized gate pattern on a photomask, are shown superimposed on an active area 106 of a CMOS cell. The as-drawn gate patterns 202, 204 are relatively high-aspect rectangles defined on either a positive or negative photomask. For a given photomasking process with the same amount of resist trimming, the as-drawn gate patterns 202, 204 are shorter than similar, conventional as-drawn gate patterns (compare, FIG. 1A, ref. nums. 102, 104). In other words, the as-drawn gate patterns are shorter in the overlap direction, which allows higher device packing density.

Figure 2B:
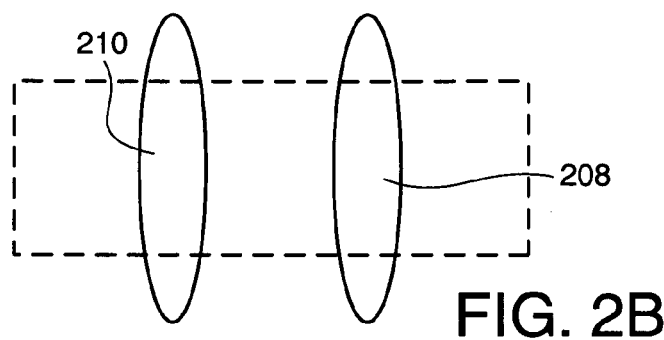

FIG. 2B is a plan view representing the CMOS cell of FIG. 2A after exposing and developing the photoresist layer. Using techniques well-known to those of skill in the art, the photoresist layer is patterned to form gate photoresist patterns 208, 210. The gate photoresist patterns 208, 210 are baked using conventional techniques. Baking the gate photoresist patterns 208, 210 hardens the photoresist. Rounding of the gate photoresist patterns 208, 210 is a well-known artifact of photoresist processing, particularly for photoresist patterns at or near the minimum critical dimension of a photolithographic process.

Figure 2C:
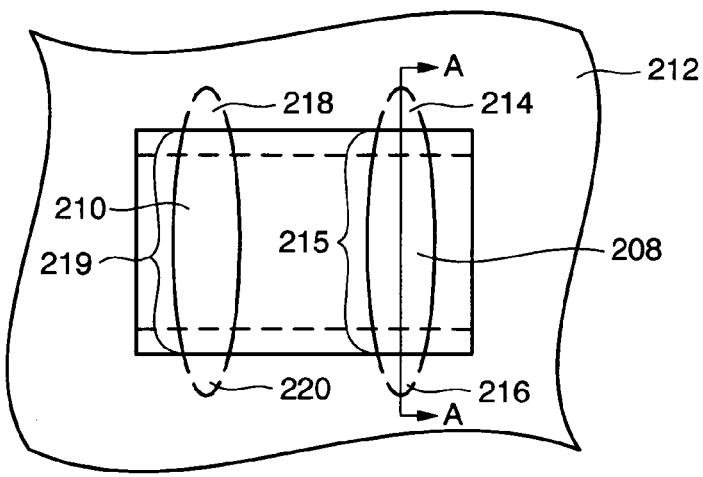

FIG. 2C is a plan view of the CMOS cell of FIG. 2B after a second photoresist layer 212 has been formed, exposed, and developed to cover end photoresist portions 214, 216, 218, 220 (shown in dashed lines because they lie underneath the second photoresist layer 212) of the gate photoresist patterns 208, 210, as well as the "darkfield" portion of the CMOS cell. The end photoresist portions will define poly endcaps in the eventual device. Center photoresist portions 215, 219 lie between the end photoresist portions and are exposed during a subsequent trimming step. The second layer of photoresist 212 is not baked.

The unbaked second layer of photoresist 212 will protect the baked end photoresist portions 214, 216, 218, 220 during a subsequent photoresist trimming step, which will reduce the channel length (i.e. narrow the center portions 215, 219 of the gate photoresist pattern) without shortening the gate photoresist pattern. The second layer of photoresist 212 will then be stripped from the wafer using a technique that leaves the first layer of photoresist (i.e. the trimmed gate photoresist pattern) sufficiently intact to provide a mask for a polysilicon etch process.

Figure 2D:
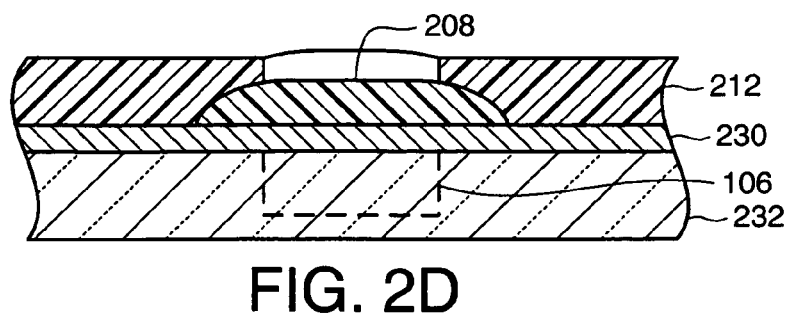

FIG. 2D is a cross section taken along A—A of FIG. 2C. A gate layer 230 has been formed on a semiconductor wafer 232. A very thin layer of gate dielectric material is between the gate layer 230 and the semiconductor wafer 232, but is not shown for simplicity of illustration. The gate layer 230 is commonly referred to as a "poly layer" because it is often a polysilicon layer; however, other materials, such as amorphous silicon, silicides, and metal gate materials are alternatively used in a gate layer. A gate layer of any suitable material will be referred to herein as a "poly layer" for purposes of convenient discussion. The gate photoresist pattern 208 extends beyond the active area 106 of the CMOS cell. The active area 106 is shown with a dashed line to represent that it is formed in the semiconductor wafer 232. The gate photoresist pattern 208 has been baked, but the second layer of photoresist 212 is not baked.

Figure 2E:
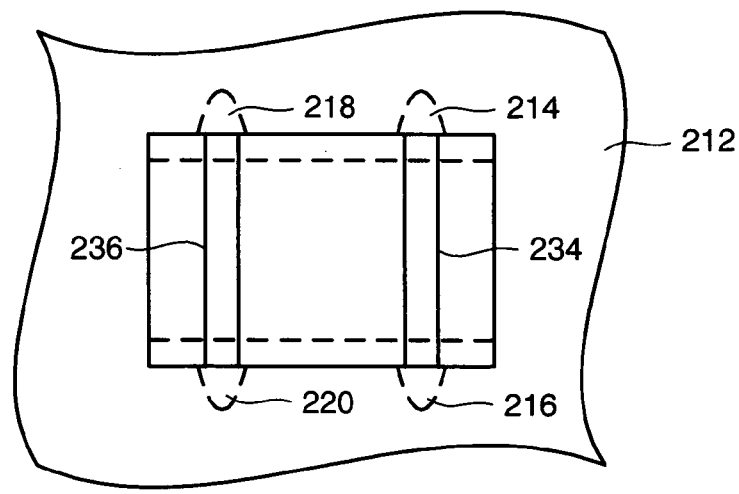

FIG. 2E is a plan view of the CMOS cell of FIG. 2C after anisotropically etching (i.e. trimming) the gate photoresist patterns and the second layer of photoresist. Center portions of the gate photoresist pattern are trimmed to form trimmed center photoresist portions 234, 236, while the end photoresist portions 214, 216, 218, 220 are not etched during the trimming process because they lie underneath, and are protected by, the second photoresist layer 212. Etching produces trimmed center photoresist portions 234, 236 that are narrower than the gate photoresist patterns 208, 210 in FIG. 2B. However, the gate photoresist patterns have the same length after trimming, which is desirable. In other words, etching the photoresist to reduce the gate length does not reduce the length of the gate photoresist patterns shown in FIG. 2B. After anisotropically etching the photoresist, the unbaked second photoresist layer 212 is stripped from the wafer using a wet resist strip, which does not significantly remove baked photoresist material from the trimmed gate photoresist patterns.

Figure 2F:
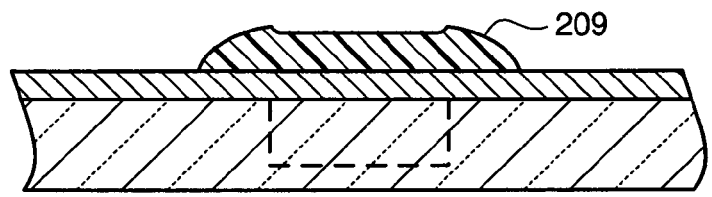

FIG. 2F is a cross section of CMOS cell of FIG. 2E after the second photoresist layer (see FIG. 2D, ref. num. 212) has been stripped, leaving a trimmed gate photoresist pattern 209. The thickness of the trimmed gate photoresist pattern 209 is reduced where the gate photoresist pattern was not covered by the second photoresist layer during trimming.

Figure 2G:
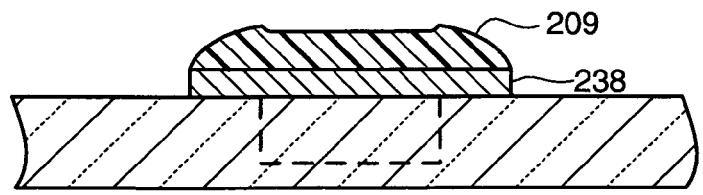

FIG. 2G is cross section of the CMOS cell of FIG. 2F after the gate layer (see FIG. 2D, ref. num. 230) has been selectively removed (e.g. etched away) using the trimmed gate photoresist pattern 209 as a process mask to form a gate structure 238. The trimmed gate photoresist patterns are then removed by ashing, which removes the baked trimmed gate photoresist pattern 209 from the gate structure 238.

Figure 2H:
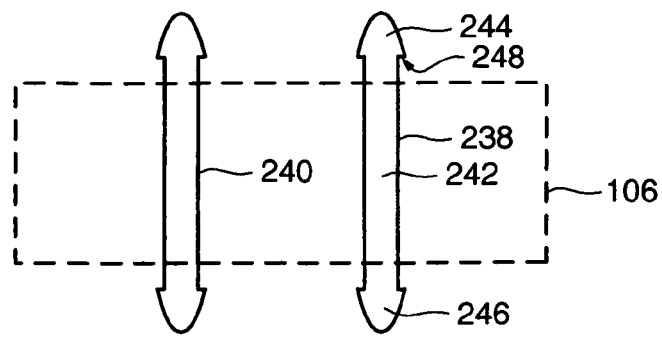

FIG. 2H is a plan view of the CMOS cell of FIG. 2G showing gate structures (e.g. polysilicon gate structures) 238, 240 relative to the active area 106. The gate structure 238 includes a trimmed center polysilicon portion 242 corresponding to the trimmed center photoresist portion (see FIG. 2E, ref. num. 234) and untrimmed poly endcaps 244, 246 corresponding to the substantially un-etched end photoresist portions (see FIG. 2E, ref. nums. 214, 216). The untrimmed poly endcaps 244, 246 are wider than the trimmed center polysilicon portion where the portions adjoin, forming a ledge or step 248.

Figure 3:
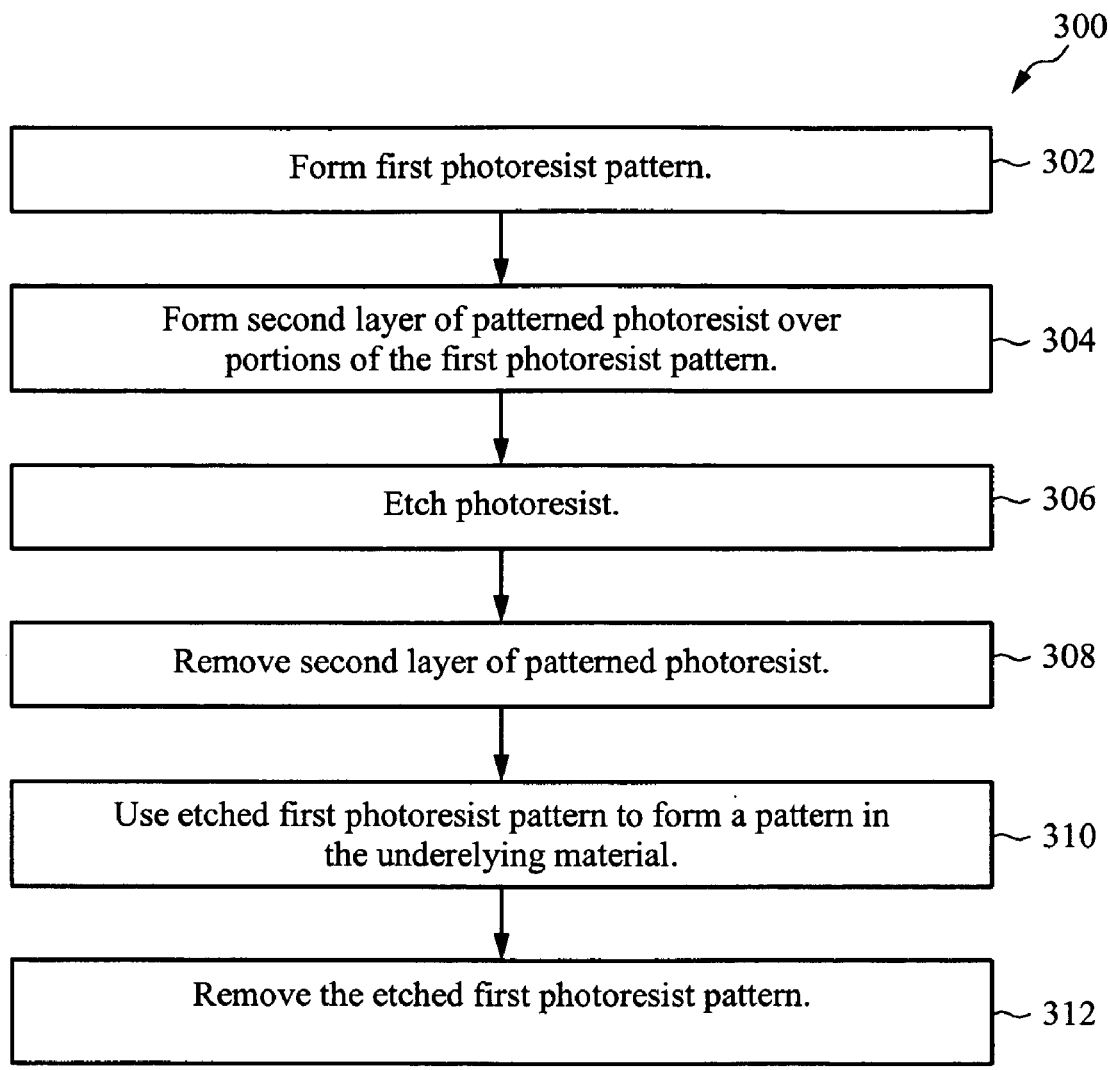
FIG. 3 is a flow chart of a method of fabricating a gate structure according to an embodiment of the invention.

FIG. 3 is a flow chart of a method of fabricating a gate structure 300 according to an embodiment of the invention. A gate photoresist pattern including end photoresist portions is formed on a gate layer (step 302). In a particular embodiment, the gate layer is a layer of polysilicon on a silicon wafer. A second photoresist layer is formed over the end photoresist portions, and not over a center portion of the gate photoresist pattern between the end photoresist portions (step 304). The gate photoresist pattern and second photoresist layer are trimmed (i.e. anisotropically etched) so as to reduce the width of the gate photoresist pattern between the end photoresist portions (i.e. to reduce the active gate length) without reducing the length of the gate photoresist pattern (step 306). The second photoresist layer is stripped (step 308) and a gate structure is formed in the gate layer according to the pattern of the trimmed gate photoresist pattern (step 310), such as by etching to remove the gate material where it is not protected by the trimmed gate photoresist pattern. The trimmed gate photoresist pattern is removed from the gate structure (step 312), such as by ashing or other suitable technique. The resulting gate structure has poly endcaps that are wider than a center poly portion. The length of the gate structure is essentially the length of the gate photoresist pattern before it was trimmed.

While the present invention has been described in connection with specific embodiments, variations of these embodiments will be obvious to those of ordinary skill in the art. For example, other types of photoresist systems are used in alternative embodiments so that the second photoresist pattern can be selectively removed without removing the gate strip photoresist. In yet other embodiments, a hard mask layer is deposited and patterned between the photoresist layers. Therefore, the spirit and scope of the appended claims should not be limited to the foregoing description.

We claim:

1. A method of fabricating a gate structure on a substrate comprising:
    forming a gate photoresist pattern having a length, a center photoresist portion, and end photoresist portions;
    forming a photoresist layer over the end photoresist portions;
    trimming the center photoresist portion to form a trimmed center photoresist portion;
    removing the photoresist layer;
    forming the gate structure in a gate layer; and
    removing the trimmed center photoresist portion and the end photoresist portions from the substrate.

2. The method of claim 1 wherein the gate layer comprises polysilicon.

3. The method of claim 1 wherein the gate photoresist pattern comprises baked photoresist and the photoresist layer comprises unbaked photoresist.

4. The method of claim 1 wherein the gate structure includes a ledge between a center polysilicon portion and a poly endcap of the gate structure.

5. The method of claim 1 wherein the gate structure is substantially the length of the gate photoresist pattern.

6. The method of claim 1 wherein a center polysilicon portion of the gate structure overlies and extends beyond an active area of a complementary metal-oxide-semiconductor cell.

7. The method of claim 1 wherein the trimming step comprises ashing.

8. The method of claim 1 wherein the step of removing the trimmed center photoresist portion and the end photoresist portions comprises ashing.

9. The method of claim 1 further comprising:
    forming a second gate photoresist pattern having a second length, a second center photoresist portion, and second end photoresist portions;
    forming a second photoresist layer over the second end photoresist portions;
    trimming the second center photoresist portion to form a second trimmed center photoresist portion;
    removing the second photoresist layer;
    forming a second gate structure in the gate layer; and
    removing the second trimmed center photoresist portion and the second end photoresist portions from the substrate.

10. A complementary metal-oxide-semiconductor cell made according to the method of claim 9.

11. A metal-oxide-semiconductor ("MOS") device comprising:
    an active area; and
    a first gate structure having
        a first untrimmed endcap,
        a second untrimmed endcap, and
        a first trimmed center portion between the first untrimmed endcap and the second untrimmed endcap.

12. The MOS device of claim 11 wherein the first trimmed center portion overlies and extends beyond the active area and the first untrimmed endcap and the second untrimmed endcap lie outside the active area.

13. The MOS device of claim 11, the first gate structure further having a ledge formed between the first trimmed center portion and the first untrimmed endcap.

14. The MOS device of claim 11 further comprising a second gate structure having a second trimmed center portion, a third endcap and a fourth endcap, wherein the second trimmed center portion overlies and extends beyond the active area and the third endcap and fourth endcap lie outside the active area.

15. The MOS device of claim 14 comprising a complementary metal-oxide-semiconductor cell.

16. A method of directionally trimming polysilicon width comprising:
    means for forming a photoresist pattern;
    means for covering a selected portion of the photoresist pattern with a second photoresist layer so as to form exposed portions of the photoresist pattern and covered portions of the photoresist pattern;
    means for etching the exposed portions of the photoresist pattern without substantially etching the covered portions of the photoresist pattern to form an etched photoresist pattern;
    means for removing the second photoresist layer without removing the etched photoresist pattern;
    means for forming a pattern in material underlying the etched photoresist pattern; and
    means for removing the etched photoresist pattern.

* * * * *